(12) United States Patent
Hsu

(10) Patent No.: US 6,211,001 B1
(45) Date of Patent: Apr. 3, 2001

(54) ELECTROSTATIC DISCHARGE PROTECTION FOR SALICIDED DEVICES AND METHOD OF MAKING SAME

(75) Inventor: Sheng Teng Hsu, Camas, WA (US)

(73) Assignees: Sharp Laboratories of America, Inc., Camas, WA (US); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/122,494

(22) Filed: Jul. 24, 1998

(51) Int. Cl.[7] ................................................. H01L 21/8238
(52) U.S. Cl. ......................... 438/220; 438/200; 438/286; 437/15; 437/60
(58) Field of Search ..................... 438/220, 286, 438/200; 437/60, 15

(56) References Cited

U.S. PATENT DOCUMENTS

| 5,597,758 | * | 1/1997 | Heim et al. | 437/60 |
| 5,677,205 | * | 10/1997 | Williams et al. | 437/15 |
| 5,937,298 | * | 8/1999 | Hung et al. | 438/286 |

FOREIGN PATENT DOCUMENTS

| 0445756 | 9/1991 | (EP) . |
| 0459770 | 12/1991 | (EP) . |
| 0654830 | 5/1995 | (EP) . |
| 2292480 | 2/1996 | (GB) . |

OTHER PUBLICATIONS

S. Voldman et al., Dynamic Threshold Body—and Gate–Coupled SOI ESD Protection Networks, EOS/ESD Symposium 97–210, pp. 3A.2.1–3A.2.11.

D. Krakauer et al., ESD Protection in a 3.3V Sub–Micron Silicided CMOS Technology, EOS/ESD Symposium 92–250, pp. 5B.4.1–5B.4.8.

G. Notermans, On the Use of N–Well Resistors for Uniform Triggering of ESD Protection Elements, EOS/ESD Symposium 97–221, pp. 3A.3.1–3A.3.9.

* cited by examiner

*Primary Examiner*—Richard Elms
*Assistant Examiner*—Pho Luu
(74) *Attorney, Agent, or Firm*—David C. Ripma; Matthew D. Rabdau; Scott C. Krieger

(57) ABSTRACT

A method of forming an electrostatic discharge protected salicided device includes forming, on a single crystal substrate, a source region, a gate channel and a drain region, wherein the source region and drain region are formed by implanting ions of a first type using a low doping density process; depositing a gate oxide layer over the gate channel; masking at least a portion of the drain region and at least a portion of the gate channel and gate oxide layer; implanting ions of a second type to form an area between the source region and gate channel and between the drain region and gate channel thereby to separate the drain region from the gate channel; and forming salicide layers over the drain region and source region, wherein the salicide layers are separated from the gate channel.

5 Claims, 4 Drawing Sheets

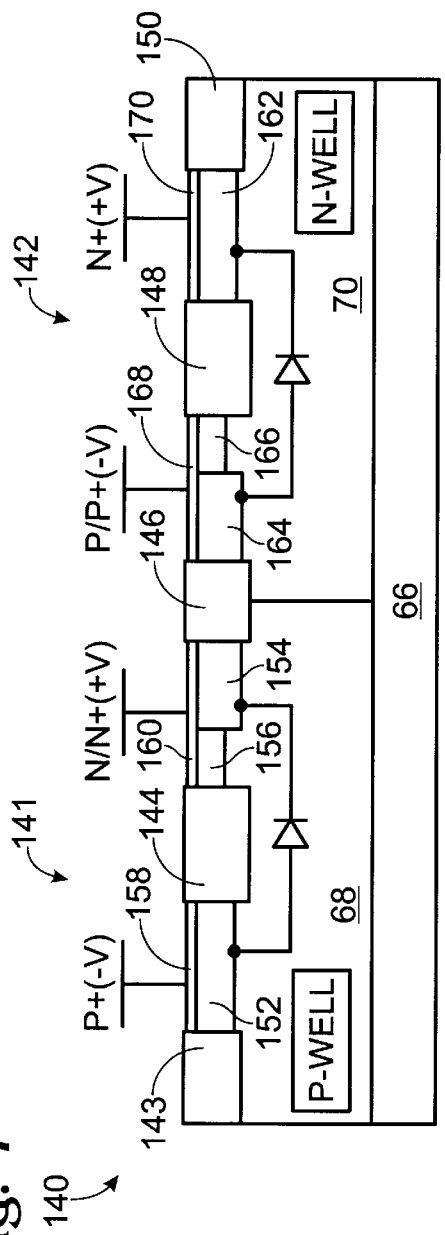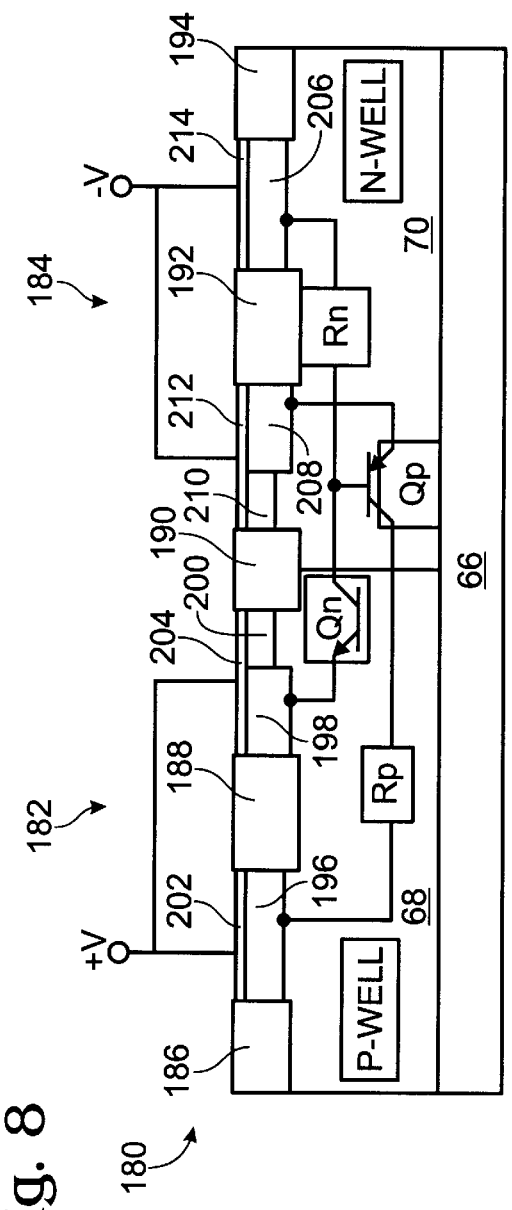

ELECTROSTATIC DISCHARGE PROTECTION FOR SALICIDED DEVICES AND METHOD OF MAKING SAME

FIELD OF THE INVENTION

This invention relates to integrated circuits, and specifically to a structure and method for providing electrostatic discharge protection for integrated circuits containing a salicide component.

BACKGROUND OF THE INVENTION

Silicon based integrated circuits are susceptible to electrostatic discharge (ESD) damage, particularly in the situation where a user of a device containing an integrated circuit develops a static charge on their body and subsequently comes in contact with the device containing the integrated circuit. The electrostatic charge induced in a human body may produce a voltage on the order of 5,000 volts. As most integrated circuits operate at no higher than five volts, an electrostatic discharge from a human body can be a traumatic experience for the integrated circuit. One way to provide an integrated circuit with ESD protection is to build an integrated circuit on a substrate that is less susceptible to damage from ESD. The integrated circuit may be fabricated on bulk silicon substrates, silicon on insulator (SOI) substrates, or separation by implantation of oxygen (SIMOX) substrates.

Electrostatic Discharge (ESD) Protection is generally provided by the addition of a masking step during manufacture of an integrated circuit device to prevent silicidation of a drain region adjacent to the gate electrode. This technique, however, does not provide complete ESD protection, and requires additional steps, time, and expense in the manufacturing process.

SUMMARY OF THE INVENTION

A method of forming an electrostatic discharge protected salicided device includes forming, on a single crystal substrate, a source region, a gate channel and a drain region, wherein the source region and drain region are formed by implanting ions of a first type using a low doping density (LDD) process; depositing a gate oxide layer over the gate channel; masking at least a portion of the drain region and at least a portion of the gate channel and gate oxide layer; implanting ions of a second type to form an area between the source region and gate channel and between the drain region and gate channel thereby to separate the drain region from the gate channel; and forming salicide layers over the drain region and source region, wherein the salicide layers are separated from the gate channel.

It is an object of the invention to provide a CMOS structure with robust ESD protection without using an additional mask.

Another object of the invention is to provide a method of making a robust ESD protected device using a minimal number of steps.

BRIEF DESCRIPTION OF THE DRAWINGS

FIG. 2b is the equivalent circuit of the transistor with prior art ESD protection shown in FIG. 2a.

FIG. 3b is the equivalent circuit of the structure shown in FIG. 3a.

FIG. 7 depicts a step in the construction of a p/n junction device according to the invention.

FIG. 8 depicts a step in the construction of a SCR device according to the invention.

DETAILED DESCRIPTION OF THE PREFERRED EMBODIMENT

The electrostatic discharge (ESD) current of a MOS transistor is actually conducted through a parasitic bipolar transistor. Using an nMOS transistor (nMOST) as an example, at the beginning of an ESD event, a large voltage is applied to the drain of the nMOST. This causes an avalanche breakdown to occur at the drain junction. Electrons flow to the drain electrode while holes flow to the substrate. The hole current flow causes a voltage drop, which results in a forward bias of the source junction. This bias voltage turns on the npn parasitic bipolar transistor.

Figure 1:
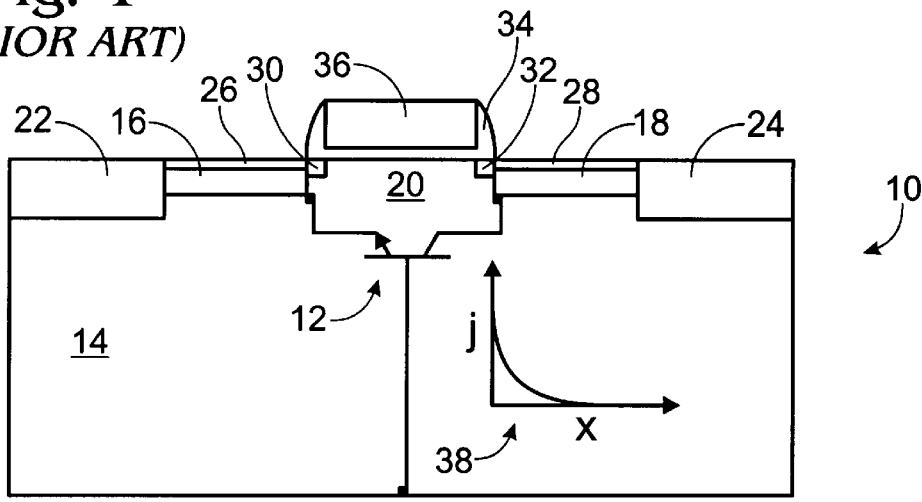
FIG. 1 is a cross-section of a portion of a parasitic bipolar transistor in a MOS transistor.

Referring to FIG. 1, a cross section of portion of a MOS transistor is shown generally at 10, and an overlay of the circuit schematic is shown at 12. Transistor 10 includes a substrate 14, a $n^+$ source region 16, a $n^+$ drain region 18 and a gate region 20. Additionally, oxide isolation regions 22, 24 extend about the periphery of the structure. Silicide regions 26, 28 overlay the source and drain regions, respectively, while lightly doped regions 30, 32 are located on either side of gate region 20. An oxide cup 34 is located above gate region 20, and is filled by a polysilicon gate electrode 36. The parasitic bipolar transistor is formed by source 16 as an emitter, substrate (well) 14 as a base, and drain region 18 as collector.

Silicide layers 26, 28 are very highly conductive. The collector current of the parasitic bipolar transistor is concentrated at the very edge of the $n^+$ drain junction adjacent gate channel 20. The current density distribution at the drain junction is sketched in a graph inset, 38, of FIG. 1. Inset 38 depicts j vs. x, and shows that the current density distribution, j, decreases rapidly as x, the distance away from the gate channel region, increases.

Figure 2A:
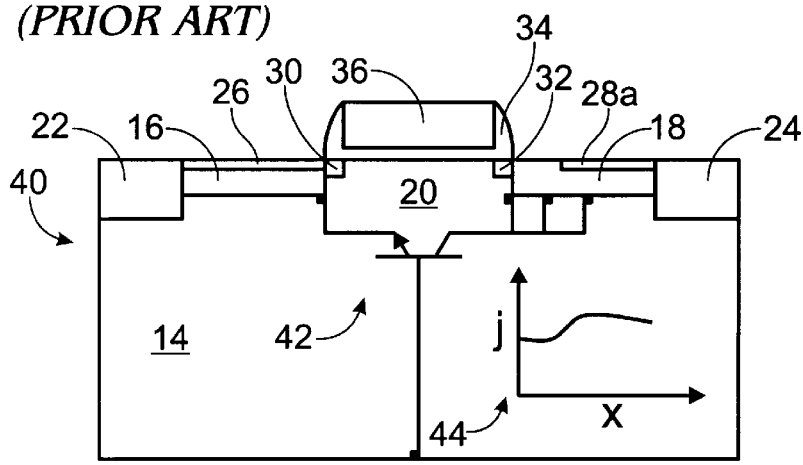
FIG. 2a is a cross-section of a portion of a bipolar transistor with prior art ESD protection.
Figure 2B:
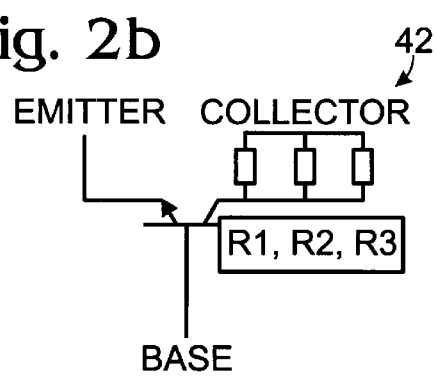

A known solution to this problem is to add a mask to prevent silicidation of the drain junction adjacent to the gate electrode. A prior art MOS transistor so constructed is depicted generally at 40 in FIG. 2a. The equivalent circuit is shown at 42 in FIG. 2b, and in the schematic inset of FIG. 2a, where R1>R2>R3. The current distribution becomes more uniform, as is shown in the graph inset at 44. This structure is similar to that shown in FIG. 1, however, a silicide region 28a does not extend fully across drain region 18. The process to form such a device, however, requires one additional masking step during device construction, which increases production cost and complicates the construction process.

The present invention makes use of the fact that a silicide-to-silicon contact is ohmic only if the silicon is heavily doped. The contact resistance is strongly dependent on the doping density when the silicon doping density is relatively low. For low-to-medium doped silicon, wherein ions are implanted at a concentration generally in the range of $1.0 \cdot 10^{18}$ cm$^{-3}$ to $5.0 \cdot 10^{19}$ cm$^{-3}$, the contact resistance is large. A lower doping density results in a larger contact resistance. This characteristic is used in the present invention to fabricate devices having selected levels of contact resistance to create a robust ESD device. Used herein, a process step described as implanting ions using a low doping density process means implanting ions to a concentration generally in the range of $1.0 \cdot 10^{18}$ cm$^{-3}$ to $5.0 \cdot 10^{19}$ cm$^{-3}$.

Figure 3A:
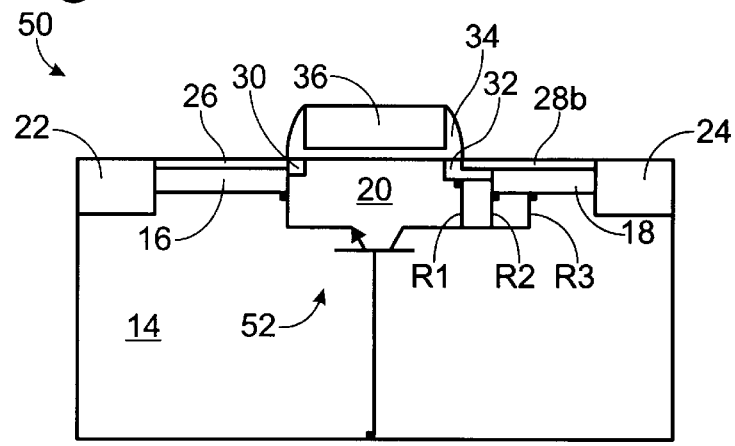
FIG. 3a is a cross-section of a portion of a LDD structure according to the invention.
Figure 3B:
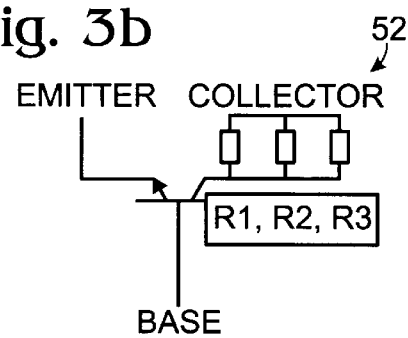

Referring now to FIG. 3a, a portion of an nMOS transistor is depicted at 50, while the equivalent circuit is depicted in FIG. 3b at 52. Layers 30, 32 are lightly doped regions. Layer 32 serves to space drain region 18 from gate channel 20. A silicide layer 28b extends over drain region 18 and layer 32. In this embodiment of the invention, source region 16 and drain region 18 are formed by a LDD process, by implanting arsenic ions at a dose of $5.0 \cdot 10^{12}$ cm$^{-2}$ to $5.0 \cdot 10^{14}$ cm$^{-2}$ at an energy of 20 kev to 50 kev. R1 is the sum of LDD resistance and the LDD to silicide contact resistance. R3 is equal to the n$^+$ layer resistance and R2 is in between. Therefore, R1>R2>R3. As a result the current distribution in the drain n$^+$ junction is more uniform, similar to that of the prior art process. The same technique can be applied to the formation for SCR ESD protection, as shown in FIG. 8.

Figure 4:
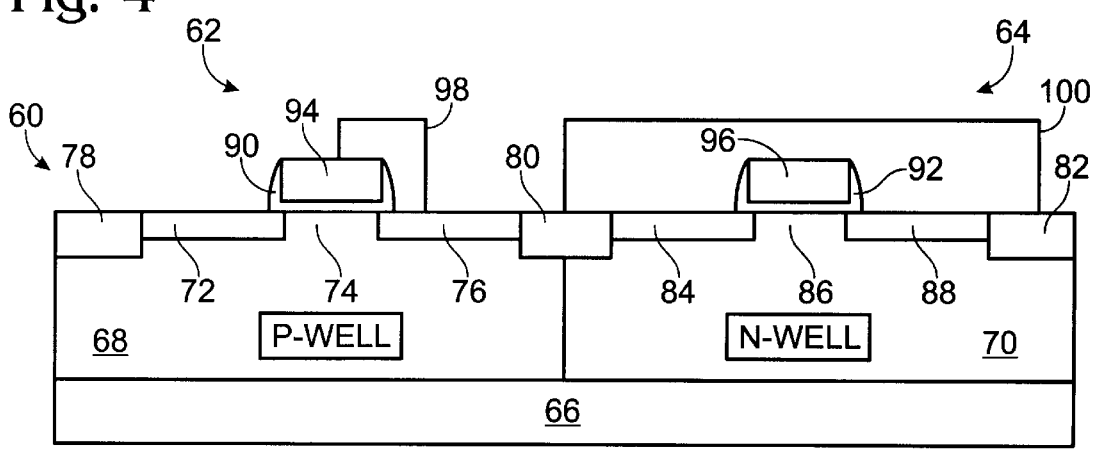
FIG. 4 depicts an intermediate step in the construction of an ESD protected device according to the invention.

Referring now to FIG. 4, a CMOS transistor pair is provided as an example of device fabrication, generally at 60. Device 60 will include a nMOS transistor 62 and a pMOS transistor 64. Device 60 is formed on a substrate of single crystal silicon 66. Two device areas are formed on the substrate: a p$^-$ well 68 and a n$^-$ well 70. State of the art processes are followed to form n$^-$ well, p$^-$ well. The device areas are isolated by STI or LOCOS isolation techniques.

A typical STI (Shallow Trench Isolation) process begins with the deposition of a thin layer of silicon oxide, in the range of 10 nm to 50 nm, onto substrate 66, after which, a layer of silicon nitride is deposited to a thickness of between 50 nm to 200 nm. A pattern of photoresist is applied over the portion of the active area where the active devices are to be constructed. The nitride and the oxide layers are etched in the areas not covered by photoresist, after which, the underlying silicon is etched to a depth of 400 nm to 700 nm. The photoresist is stripped away and the wafer is cleaned. Next, a thin layer of silicon oxide is grown onto the surface of the etched silicon, and a layer of silicon oxide is deposited over the entire substrate. The thickness of this oxide layer is at least equal to the depth of the previously formed silicon trenches. The wafer is then subjected to a CMP process to polish the excessive silicon oxide away. The CMP stops at the level of the silicon nitride. The silicon nitride is etched with hot phosphorus acid H$_2$PO$_3$, and the oxide pads over the active areas are removed by BHF solution. This completes the formation of the STI structure.

Local oxidation of silicon (LOCOS) is a local oxidation process used to isolate a device area. As in the STI process, a thin oxide pad, having a thickness of 10 nm to 40 nm, is deposited on substrate 66. Next, a silicon nitride layer is deposited to a thickness of between 100 nm to 200 nm. The active areas is masked with photoresist and the nitride in the field areas is removed by a hot phosphorus acid etching process. The photoresist is stripped and the wafer is subjected to a high temperature oxidation process. The oxidation temperature is typically between 950° C. to 1100° C. This process grows silicon dioxide on the exposed silicon surface area, i.e., those areas not covered with silicon nitride. No oxide will grow under the silicon nitride layers. After the growth of the oxide layer, the nitride and the pad oxide are removed. The active device areas are separated by a thick layer of oxide. The threshold voltage is adjusted by ion implantation.

After the growth of the gate oxide is completed, polysilicon is deposited, and is selectively etched to form gate electrodes 94, 96. A source region 72, gate channel 74 and drain region 76 are formed for nMOS transistor 62. Source region 72 and drain region 76 are formed by nLDD, by implanting arsenic ions at a dose of $5.0 \cdot 10^{12}$ cm$^{-2}$ to $1.0 \cdot 10^{14}$ cm$^{-2}$ at an energy of 20 kev to 50 kev. Oxide isolation regions 78, 80 and 82 are STI regions.

A drain region 84, gate channel 86 and source region 88 are formed for pMOS transistor 70. Source region 88 and drain region 84 are, in this instance, formed by pLDD, by implanting BF$_2$ ions at a dose of $5.0 \cdot 10^{12}$ cm$^{-2}$ to $1.0 \cdot 10^{14}$ cm$^{-2}$ at an energy of 20 kev to 50 kev. Gate electrode side wall oxide is formed by CVD of silicon oxide and a plasma etch-back process to form oxide cups 90, 92, about gate electrodes 94, 96.

Structure 60 is covered with photoresist, as shown in FIG. 4 at 98, 100, for n$^+$ ion implantation. This mask covers all of the pMOS areas and portion of nMOS drain region and adjacent gate channel area.

An n$^+$ source region 104 and an n$^+$ drain region 106 are formed by implanting arsenic ions at a dose of $1.0 \cdot 10^{15}$ to $5.0 \cdot 10^{15}$ cm$^{-2}$ at an energy of 20 kev to 50 kev. The photoresist is stripped, resulting in the structure depicted in FIG. 5.

Figure 5:
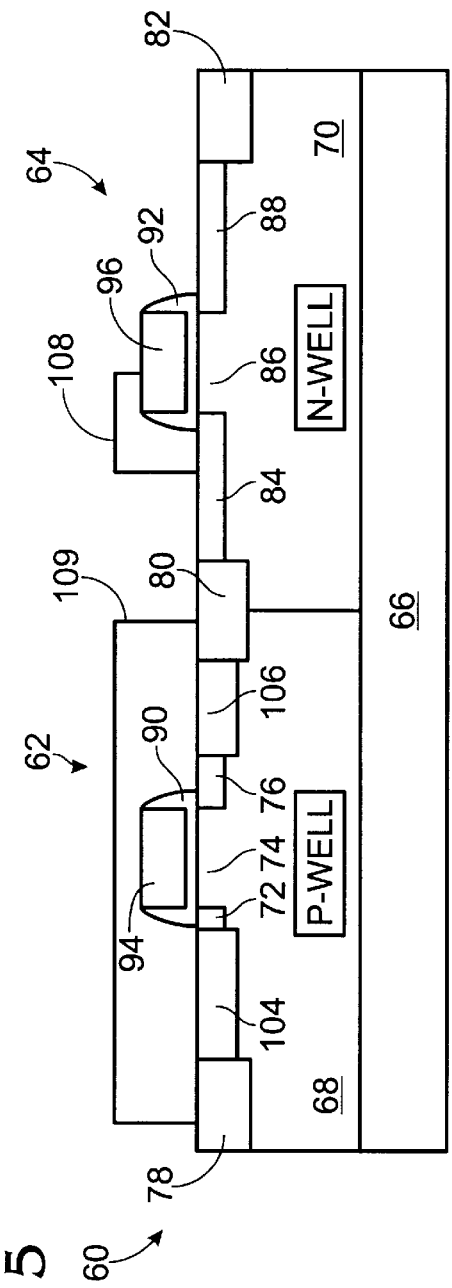
FIG. 5 depicts a further step in the construction of an ESD protected device according to the invention.
Figure 6:
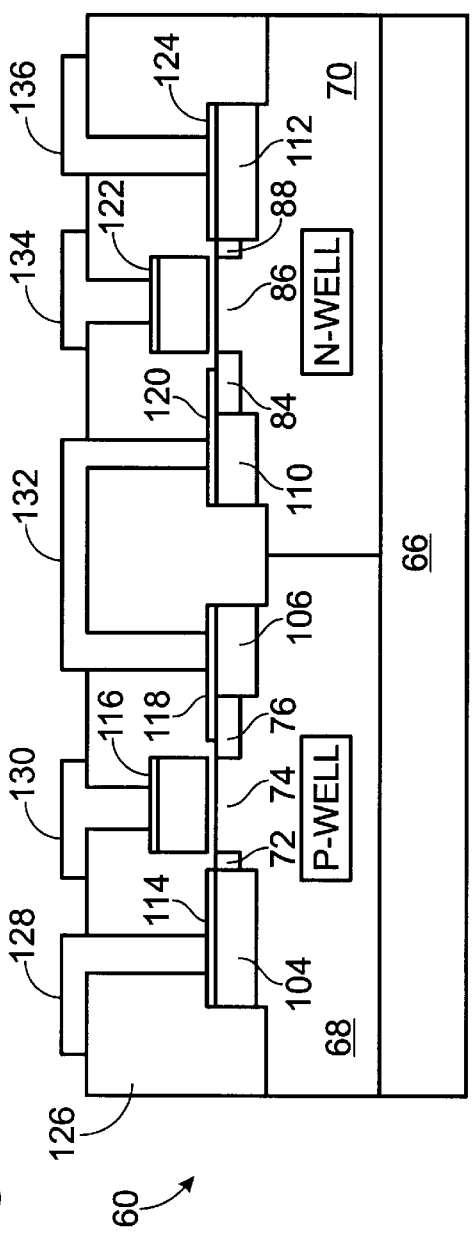
FIG. 6 is a cross section of a CMOS transistor pair constructed according to the invention.

Still referring to FIG. 5, photoresist, 108, 109, is applied as shown for p$^+$ ion implantation. This mask covers all nMOS areas and portion of pMOS drain area and adjacent gate area. P$^+$ ion implantation includes BF$_2$ ions at a dose of $1.0 \cdot 10^{15}$ cm$^{-2}$ to $5.0 \cdot 10^{15}$ cm$^{-2}$ at an energy of 20 kev to 50 kev. This results in the formation of a p$^+$ drain region 110 and a p$^+$ source region 112 (FIG. 6). Again, the photoresist is stripped.

Silicide layers 114, 116, 118, 120, 122, and 124 are formed by a salicide process, wherein the wafer is cleaned, and the oxide on the source, drain and gate top surfaces is removed by a BHF etching process. A layer of Ti or Co, or other suitable refractory metal, is deposited onto the silicon wafer to a thickness of 5 nm to 20 nm. The wafer is then heated in a nitrogen ambient atmosphere, at 600° C. to 650° C. for Ti, and 500° C. to 600° C. for Co, for 10 to 30 seconds to form metal rich silicide onto the areas where silicon contacts the refractory metal. The unreacted metal is removed by selective chemical dissolution, such as Piranha, or in HCl/H$_2$O$_2$ mixture. Additional heat treatment, at 700° C. to 900° C. in a nitrogen ambient atmosphere for 20 seconds to 1 minute converts the metal-rich silicide to low-resistance disilicide.

The structure is covered with an oxide layer 126 by CVD, and etched for metallization. Metallization forms source electrode 128, which is a Vss terminal, gate electrode 130, a common drain electrode 132, a gate electrode 134 and a source electrode 136, which is a Vdd terminal. As is shown in FIG. 6, the silicide layers are laterally separated from the gate channel regions, thereby providing robust ESD protection. Specifically, silicide layers 118, 120 overlying drain regions 76, 84, respectively, are separated from gate channel 74, 86, by 20 nm to 150 nm, while silicide layers 114, 124 overlying source regions 72, 88, respectively, are laterally separated from the gate channels by 20 nm to 150 nm.

FIG. 7 depicts the layout of p/n junction 140 having ESD protection. Junction 140 includes p-well structure 141 and n-well structure 142. A circuit schematic is overlaid on the cross section. The structures are formed on a substrate 66. P⁻ well 68 and n⁻ well 70 are formed to the substrate 66. Oxide isolation regions 143, 144, 146, 148 and 150 are formed before the construction of the p/n junction according to the invention. A p⁺ layer 152 and a n⁺ layer 154 are formed simultaneously with the source/drain ion implantation. A lighted doped n⁻ layer 156 and a p⁻ layer 166 are formed at the same time of LDD ion implantation.

N⁺ layer 162, p⁺ layer 164 and lighted doped p⁻ layer 166 are formed on n⁻ well structure 142. Silicide layers 158, 160, 168 and 170 are formed as previously described.

FIG. 8 depicts the layout of a SCR 180 for ESD protection, with an overlaid circuit schematic. P⁻ well 68 and n⁻ well 70 are formed on substrate 66. STI regions 186, 188, 190, 192 and 194 are formed as previously described. P⁺ layers 196, 208 and n⁺ layers 198, 206 are formed simultaneously with the p⁺ and n⁺ source drain ion implantation. An n layer 200 and p⁻ layer 210 are formed during the LDD ion implantation for nMOS and pMOS, respectively. Silicide layers 202, 204, 212, and 214 are formed during the salicide process for the MOS transistors. An n⁻ well structure 184, n⁺ layer 206, p⁺ layer 208 and p⁻ layer 210 are formed. Silicide layers 202, 204, 212 and 214 are formed simultaneously during the CMOS salicide process.

Thus, an ESD protected salicided device and a method of making the same have been disclosed. Although a preferred embodiment of the invention, and several variations thereof, has been disclosed, it will be appreciated by those of skill in the art that further variations and modifications may be made without departing from the scope of the invention as defined in the appended claims.

I claim:

1. A method of forming an electrostatic discharge protected salicided device comprising:

forming, on a single crystal substrate, a source region, a gate channel and a drain region, wherein the source region and drain region are formed by implanting ions of a first type using a low doping density process which includes implanting ions at a concentration generally in the range of $1.0 \cdot 10^{18}$ cm⁻³ to $5.0 \cdot 10^{19}$ cm⁻³;

depositing a gate oxide layer over the gate channel;

masking at least a portion of the drain region and at least a portion of the gate channel and gate oxide layer;

implanting ions of a second type to form an area between the source region and gate channel and between the drain region and gate channel thereby to separate the drain region from the gate channel; and forming salicide layers over the drain region and source region, wherein the salicide layers are separated from the gate channel.

2. The method of claim 1 wherein said using a low doping density process includes implanting As ions at a dose of between about $5.0 \cdot 10^{12}$ cm⁻² to $1.0 \cdot 10^{14}$ cm⁻² at an energy of 20 kev to 50 kev.

3. The method of claim 1 wherein said using a low doping density process includes implanting BF₂ ions at a dose of between about $5.0 \cdot 10^{12}$ cm⁻² to $1.0 \cdot 10^{14}$ cm⁻² at an energy of 20 kev to 50 kev.

4. A method of forming an electrostatic discharge protected salicided device comprising:

forming, on a single crystal substrate, a source region, a gate channel and a drain region, wherein the source region and drain region are formed by implanting ions of a first type using a low doping density process;

depositing a gate oxide layer over the gate channel;

masking at least a portion of the drain region and at least a portion of the gate channel and gate oxide layer;

implanting ions of a second type to form an area between the source region and gate channel and between the drain region and gate channel thereby to separate the drain region from the gate channel; and forming salicide layers over the drain region and source region, including separating, laterally, the salicide layer overlying the drain region from the gate channel by a distance of at least 20 nm.

5. A method of forming an electrostatic discharge protected salicided device comprising:

forming, on a single crystal substrate, a source region, a gate channel and a drain region, wherein the source region and drain region are formed by implanting ions of a first type using a low doping density process;

depositing a gate oxide layer over the gate channel;

masking at least a portion of the drain region and at least a portion of the gate channel and gate oxide layer;

implanting ions of a second type to form an area between the source region and gate channel and between the drain region and gate channel thereby to separate the drain region from the gate channel; and forming salicide layers over the drain region and source region, including separating, laterally, the salicide layer overlying the source region from the gate channel by a distance of at least 20 nm.

* * * * *